(12) United States Patent
Wang (10) Patent No.: US 10,333,093 B2
(45) Date of Patent: Jun. 25, 2019

(54) OLED SUBSTRATE AND MANUFACTURE METHOD THEREOF (71) Applicant: Wuhan China Star Optoelectronics Technology Co., Ltd., Wuhan (CN)

(72) Inventor: Gaozhen Wang, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 76 days.

(21) Appl. No.: 15/503,717

(22) PCT Filed: Dec. 27, 2016

(86) PCT No.: PCT/CN2016/112445
§ 371 (c)(1),
(2) Date: Feb. 14, 2017

(87) PCT Pub. No.: WO2018/090444
PCT Pub. Date: May 24, 2018

(65) Prior Publication Data
US 2018/0212181 A1 Jul. 26, 2018

(30) Foreign Application Priority Data
Nov. 15, 2016 (CN) .......................... 2016 1 1015034

(51) Int. Cl.
*H01L 27/32* (2006.01)
*H01L 51/50* (2006.01)
(Continued)

(52) U.S. Cl.
CPC ...... *H01L 51/5092* (2013.01); *H01L 27/3246* (2013.01); *H01L 51/5044* (2013.01);
(Continued)

(58) Field of Classification Search
CPC ........... H01L 2227/323; H01L 27/3246; H01L 51/5215; H01L 51/5221; H01L 51/5044;
(Continued)

(56) References Cited

U.S. PATENT DOCUMENTS

2008/0315756 A1* 12/2008 Jeon .................... H01L 27/3246
313/504
2014/0361272 A1* 12/2014 Joo ..................... H01L 51/5056
257/40

(Continued)

FOREIGN PATENT DOCUMENTS

CN 104282713 A 1/2015
CN 104867962 A 8/2015

*Primary Examiner* — Changhyun Yi
(74) *Attorney, Agent, or Firm* — Leong C. Lei (57) ABSTRACT

The present invention provides an OLED substrate and a manufacture method thereof. In the manufacture method of the OLED substrate of the present invention, by utilizing the inorganic material to manufacture the pixel definition layer, it can reduce the risk that pixel definition layer is wrong stripped in the photoresist stripping process, and meanwhile, reduce the risk that the fine metal mask is polluted in the evaporation process to raise the usage efficiency of the fine metal mask. The OLED substrate of the present invention is manufactured by the aforesaid manufacture method of the OLED substrate. The structure of the pixel definition layer is complete, and can effectively protect the anodes and the substrate thereunder, and the element performance is good.

8 Claims, 8 Drawing Sheets

(51) Int. Cl.
*H01L 51/52* (2006.01)
*H01L 51/56* (2006.01)
(52) U.S. Cl.
CPC ...... *H01L 51/5056* (2013.01); *H01L 51/5072* (2013.01); *H01L 51/5215* (2013.01); *H01L 51/5218* (2013.01); *H01L 51/5221* (2013.01); *H01L 51/56* (2013.01); *H01L 2227/323* (2013.01)
(58) Field of Classification Search
CPC . H01L 27/3262; H01L 51/5092; H01L 51/56; H01L 51/5072; H01L 51/5218; H01L 51/5056
See application file for complete search history.

(56) References Cited

U.S. PATENT DOCUMENTS

| | | | |
|---|---|---|---|
| 2015/0207094 A1* | 7/2015 | Hwang | H01L 51/5203 257/88 |
| 2016/0254476 A1* | 9/2016 | Park | H01L 51/525 257/40 |
| 2017/0075452 A1* | 3/2017 | Kim | G06F 3/044 |

* cited by examiner

OLED SUBSTRATE AND MANUFACTURE METHOD THEREOF

FIELD OF THE INVENTION

The present invention relates to a display technology field, and more particularly to an OLED substrate and a manufacture method thereof.

BACKGROUND OF THE INVENTION

The Organic Light Emitting Diodes (OLED) display device possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device.

The OLED can be categorized as Passive matrix OLED (PMOLED) and (Active matrix OLED) AMOLED according to their driving types. The AMOLED comprises pixels arranged in array and belongs to active display type, which has high lighting efficiency and is generally utilized for the large scale display devices of high resolution.

Figure 1:
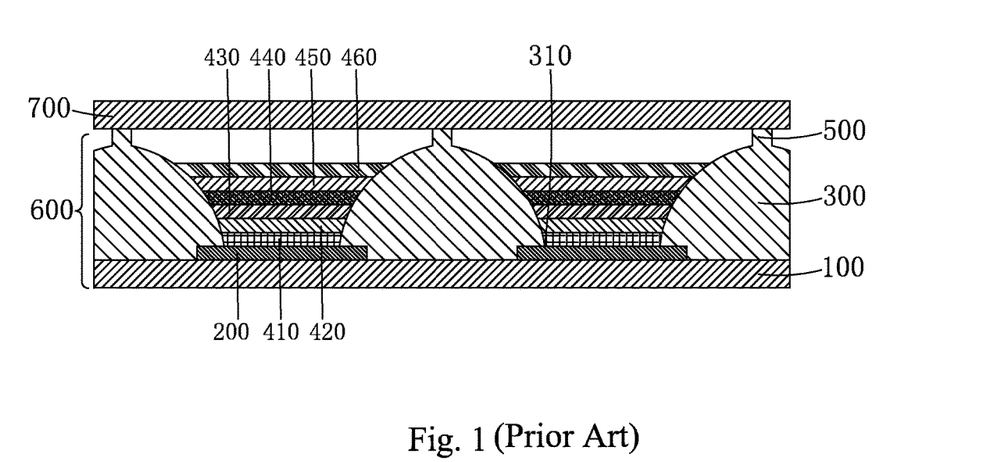
FIG. 1 is a structure diagram of an OLED display device according to prior art.

FIG. 1 is a structure diagram of an OLED display device according to prior art. As shown in FIG. 1, the OLED display device comprises: an OLED substrate 600 and a package cover plate 700 located on the OLED substrate 600; the OLED substrate 600 generally comprises: a substrate 100, a plurality of anodes 200 separately located on the substrate 100; a pixel definition layer (PDL) 300 located on the substrate 100 and the plurality of anodes 200, a plurality of spacers 500 located on the pixel definition layer 300, a plurality of openings 310 being located on the pixel definition layer 300 and respectively corresponding to the plurality of anodes 200, and a Hole Injection Layer 410, a Hole Transporting Layer 420, an organic light emitting layer 430, an Electron Transport Layer 440, an Electron Injection Layer 450 and a cathode 460 which are sequentially stacked up from bottom to top in the plurality of openings 310 and on the cathodes 200; the package cover plate 700 contacts the plurality of spacers 500 on the OLED substrate 600.

Specifically, the cathodes 200, the Hole Injection Layer 410, the Hole Transporting Layer 420, the organic light emitting layer 430, the Electron Transport Layer 440, the Electron Injection Layer 450 and the cathode 460 which are sequentially stacked up from bottom to top construct an OLED element, together. The OLED element generally uses ITO and metal to respectively be the anode 200 and the cathode 460 of the element. Under the driving of a certain voltage, the electrons and the holes are respectively injected into the Electron Transport Layer 440 and the Hole Transporting Layer 420 from the cathode 460 and the anode 200. The electrons and the holes migrate from the Electron Transport Layer 440 and Hole Transporting Layer 420 to the organic light emitting layer 430 and bump into each other in the organic light emitting layer 430 to form excitons to excite the emitting molecules. The latters can illuminate after the radiative relaxation.

Figure 2:
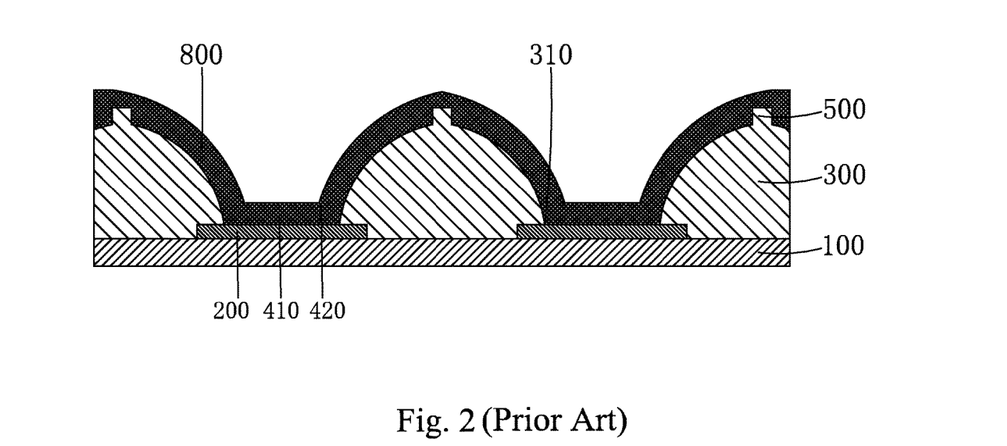
FIG. 2 is a photoresist coating diagram of an OLED substrate in the OLED display device according to prior art before the OLED process.

Specifically, in the production process of the OLED substrate 600, the manufacture process of the substrate 100, the anodes 200 and the pixel definition layer 300 is generally named to be the TFT manufacture process. The following manufacture process of the Hole Injection Layer 410, the Hole Transporting Layer 420, the organic light emitting layer 430, the Electron Transport Layer 440, the Electron Injection Layer 450 and the cathode 460 is named to be the OLED manufacture process. Because the substrate size of the OLED manufacture process is generally smaller than the substrate size of the TFT manufacture process, it is necessary to cut the accomplished substrate of the TFT manufacture process (the carrier is generally the glass) before the OLED manufacture process. The knife flywheel is used for cutting in general, and because the glass debris generated by the cutting will cause the damage to the OLED element, a photoresist (PR) layer 800 (as shown in FIG. 2) is generally coated on the surface of the accomplished substrate of the TFT manufacture process before cutting. After cutting, the photoresist layer 800 is stripped. Because the photoresist material, i.e. the same material of the photoresist layer 800, is also commonly used for manufacture the pixel definition layer 300, is can be easy to cause the wrong stripping of the pixel definition layer 300 in the stripping process of the photoresist layer 800, and after the following film structure of the Hole Injection Layer 410, the Hole Transporting Layer 420, the organic light emitting layer 430, the Electron Transport Layer 440, the Electron Injection Layer 450 and the cathode 460 is formed, it will lead to the loss of the pixel definition layer 300 for protecting the plurality of anodes 200 and the short circuit among them, and thus lead to the failure of the OLED element.

Figure 3:
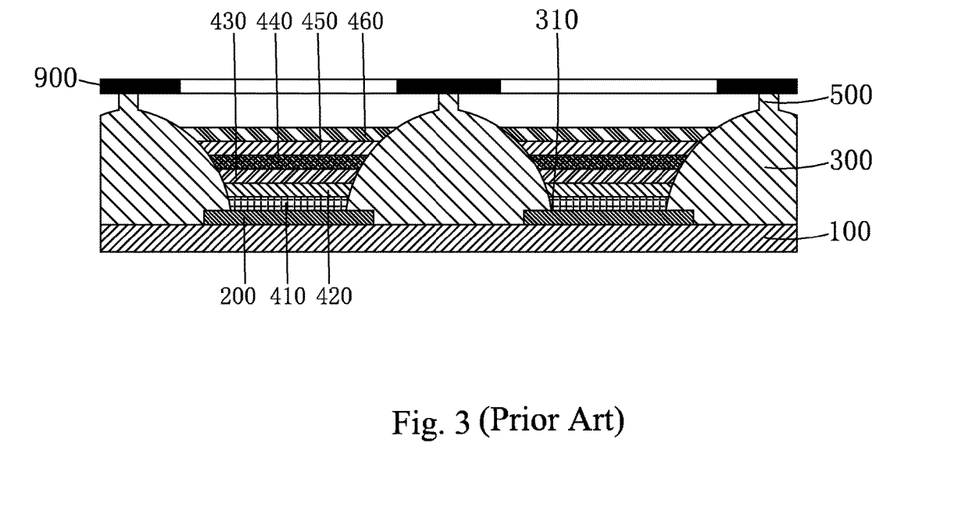
FIG. 3 is an evaporation process diagram of an OLED substrate in the OLED display device according to prior art.

Meanwhile, as shown in FIG. 3, in the OLED manufacture process, the evaporation processes for the structure layers of the Hole Injection Layer 410, the Hole Transporting Layer 420, the organic light emitting layer 430, the Electron Transport Layer 440, the Electron Injection Layer 450 and the cathode 460 need to use the FMM (Fine Metal Mask) 900. Because the stability of the photoresist material used for the pixel definition layer 300 is not strong, and is extremely volatilized onto the fine metal mask 900 to cause the pollution of the fine metal mask 900. Accordingly, the clean frequency of the fine metal mask 900 is increased, and the usage efficiency is decreased to raise the production cost.

SUMMARY OF THE INVENTION

An objective of the present invention is to provide a manufacture method of an OLED substrate of the present invention, which can reduce the risk that pixel definition layer is wrong stripped in the photoresist stripping process, and meanwhile, reduce the risk that the fine metal mask is polluted in the evaporation process.

Another objective of the present invention is to provide an OLED substrate, which is manufactured by the aforesaid manufacture method of the OLED substrate. The structure of the pixel definition layer is complete, and can effectively protect the anodes and the substrate thereunder, and the element performance is good.

For realizing the aforesaid objectives, the present invention provides a manufacture method of an OLED substrate, comprising steps of:

step 1, providing a substrate, and forming a plurality of anodes which are separately located on the substrate; depositing an inorganic film layer on the substrate and the plurality of anodes;

step 2, employing a half tone mask to implement a patterning treatment to the inorganic film layer to obtain a pixel definition layer, a plurality of spacers located on the pixel definition layer, and a plurality of openings being located on the pixel definition layer and respectively corresponding to the plurality of anodes, and each opening exposes at least a portion of the corresponding anode to manufacture a first substrate;

step 3, coating a photoresist layer on the first substrate, and the photoresist layer covering the pixel definition layer, the plurality of spacers and anodes;

cutting the first substrate coated with the photoresist layer to obtain a plurality of second substrates;

step 4, stripping the photoresist layer on the second substrate to obtain a third substrate;

step 5, sequentially forming a Hole Injection Layer, a Hole Transporting Layer, an organic light emitting layer, an Electron Transport Layer, an Electron Injection Layer and a cathode from bottom to top in the plurality of openings on the third substrate to manufacture the OLED substrate.

The substrate is a TFT substrate.

A material of the inorganic film layer comprises at least one of silicon nitride and silicon oxide.

A material of the anode is transparent conductive metal oxide, and a material of the cathode is metal.

In step 3, a knife flywheel is employed to cut the first substrate coated with the photoresist layer;

in step 4, photoresist stripper is employed to strip the photoresist layer on the second substrate;

in step 5, a fine metal mask is employed with an evaporation method to sequentially form the Hole Injection Layer, the Hole Transporting Layer, the organic light emitting layer, the Electron Transport Layer, the Electron Injection Layer and the cathode from bottom to top in the plurality of openings on the third substrate.

The present invention further provides an OLED substrate, comprising a substrate, a plurality of anodes separately located on the substrate; a pixel definition layer located on the substrate and the plurality of anodes, a plurality of spacers located on the pixel definition layer, a plurality of openings being located on the pixel definition layer and respectively corresponding to the plurality of anodes, and a Hole Injection Layer, a Hole Transporting Layer, an organic light emitting layer, an Electron Transport Layer, an Electron Injection Layer and a cathode which are sequentially stacked up from bottom to top in the plurality of openings and on the cathodes; wherein both materials of the pixel definition layer and the plurality of spacers are inorganic materials.

The substrate is a TFT substrate.

The inorganic material comprises at least one of silicon nitride and silicon oxide.

A material of the anode is transparent conductive metal oxide, and a material of the cathode is metal.

The present invention further provides a manufacture method of an OLED substrate, comprising steps of:

step 1, providing a substrate, and forming a plurality of anodes which are separately located on the substrate; depositing an inorganic film layer on the substrate and the plurality of anodes;

step 2, employing a half tone mask to implement a patterning treatment to the inorganic film layer to obtain a pixel definition layer, a plurality of spacers located on the pixel definition layer, and a plurality of openings being located on the pixel definition layer and respectively corresponding to the plurality of anodes, and each opening exposes at least a portion of the corresponding anode to manufacture a first substrate;

step 3, coating a photoresist layer on the first substrate, and the photoresist layer covering the pixel definition layer, the plurality of spacers and anodes;

cutting the first substrate coated with the photoresist layer to obtain a plurality of second substrates;

step 4, stripping the photoresist layer on the second substrate to obtain a third substrate;

step 5, sequentially forming a Hole Injection Layer, a Hole Transporting Layer, an organic light emitting layer, an Electron Transport Layer, an Electron Injection Layer and a cathode from bottom to top in the plurality of openings on the third substrate to manufacture the OLED substrate;

wherein the substrate is a TFT substrate;

wherein a material of the inorganic film layer comprises at least one of silicon nitride and silicon oxide.

The benefits of the present invention are: the present invention provides a manufacture method of an OLED substrate, and by utilizing the inorganic material to manufacture the pixel definition layer, it can reduce the risk that pixel definition layer is wrong stripped in the photoresist stripping process, and meanwhile, reduce the risk that the fine metal mask is polluted in the evaporation process, and thus to decrease the clean frequency of the fine metal mask and to raise the usage efficiency of the fine metal mask. The present invention provides an OLED substrate, which is manufactured by the aforesaid manufacture method of the OLED substrate. The structure of the pixel definition layer is complete, and can effectively protect the anodes and the substrate thereunder, and the element performance is good.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

For better explaining the technical solution and the effect of the present invention, the present invention will be further described in detail with the accompanying drawings and the specific embodiments.

In drawings.

DETAILED DESCRIPTION OF PREFERRED EMBODIMENTS

For better explaining the technical solution and the effect of the present invention, the present invention will be further described in detail with the specific embodiments.

Figure 4:
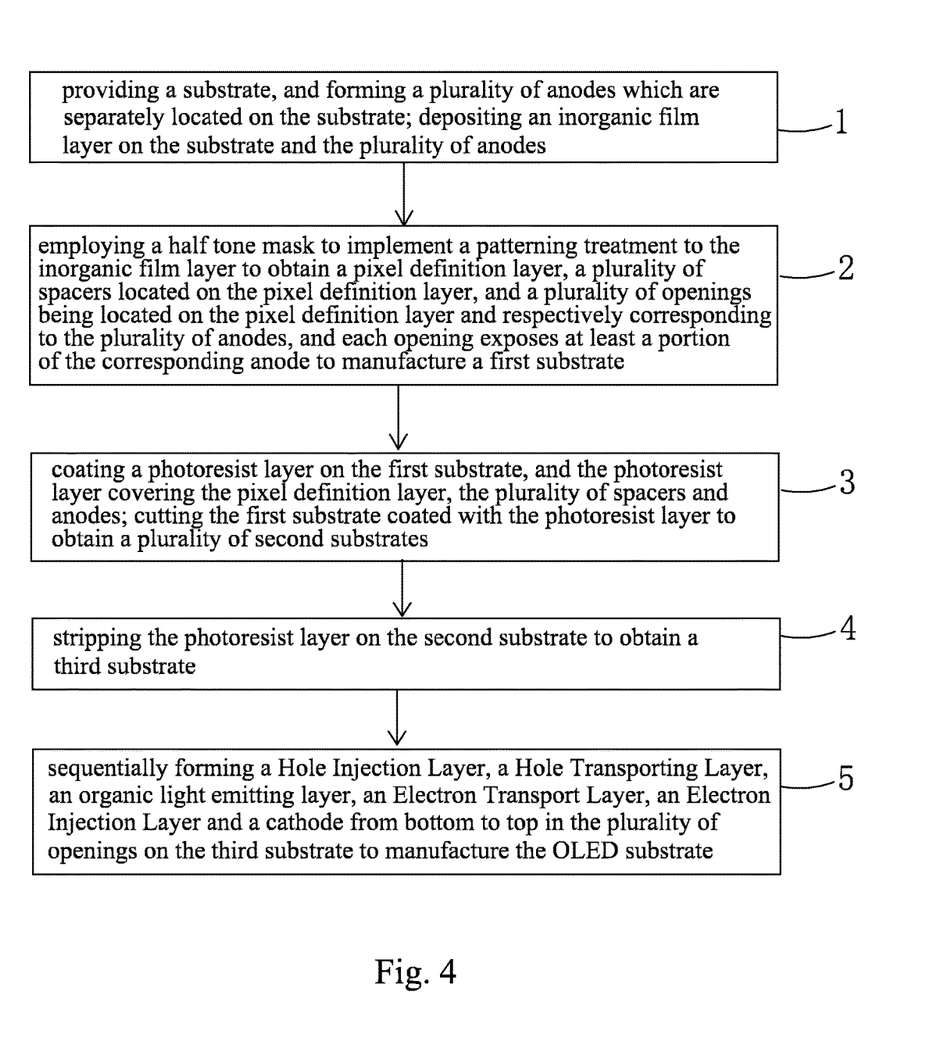
FIG. 4 is a flowchart of a manufacture method of an OLED substrate according to the present invention.
Figure 5:
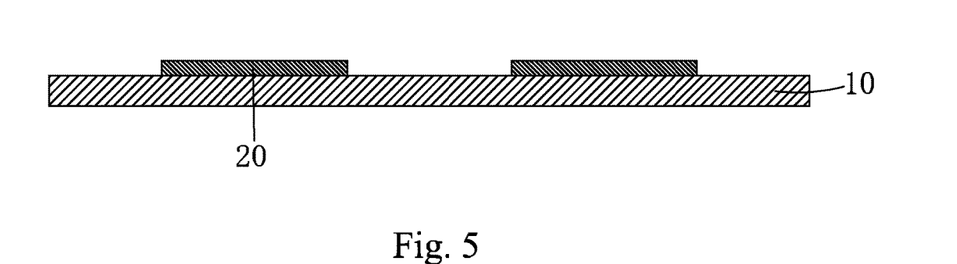
FIGS. 5-6 are diagrams of step 1 of a manufacture method of an OLED substrate according to the present invention.
Figure 6:
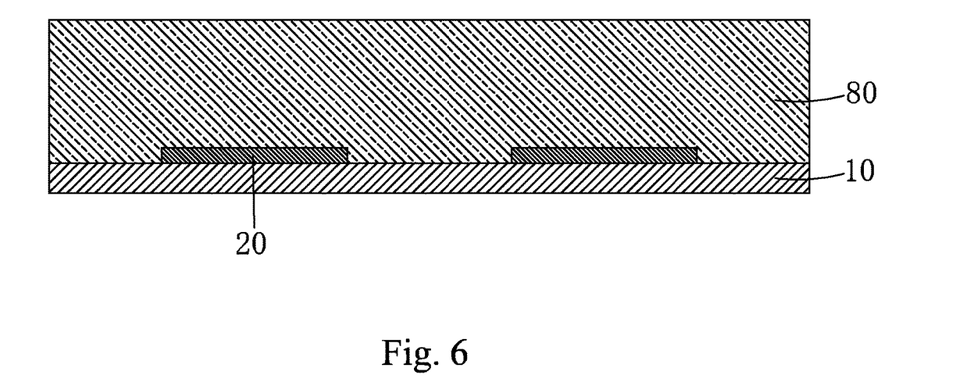

Please refer to FIG. 4. The present invention first provides a manufacture method of an OLED substrate, comprising steps of:

step 1, as shown in FIG. 5, providing a substrate 10, and forming a plurality of anodes 20 which are separately located on the substrate 10;

as shown in FIG. 6, depositing an inorganic film layer 80 on the substrate 10 and the plurality of anodes 20;

Preferably, the substrate 10 is a TFT substrate. The OLED substrate manufactured in the following is applied in an AMOLED display device.

Specifically, a material of the inorganic film layer 80 comprises at least one of silicon nitride (SiNx) and silicon oxide (SiOx).

Figure 7:
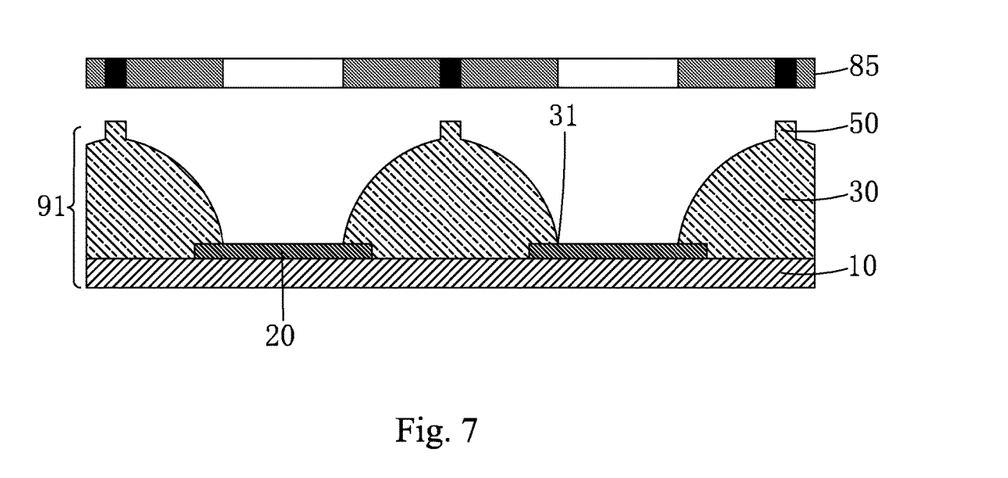
FIG. 7 is a diagram of step 2 of a manufacture method of an OLED substrate according to the present invention.

Specifically, a material of the anode 20 is transparent conductive metal oxide. Preferably, the material of the anode 20 is Indium Tin Oxide (ITO).

step 2, as shown in FIG. 7, employing a half tone mask 85 to implement a patterning treatment to the inorganic film layer 80 to obtain a pixel definition layer 30, a plurality of spacers 50 located on the pixel definition layer 30, and a plurality of openings 31 being located on the pixel definition layer 30 and respectively corresponding to the plurality of anodes 20, and each opening 31 exposes at least a portion of the corresponding anode 20 to manufacture a first substrate 91.

Figure 8:
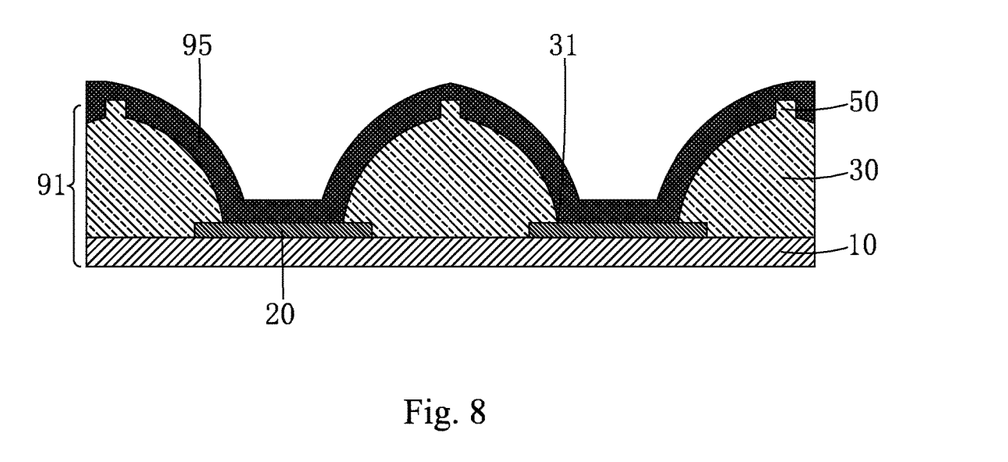
FIGS. 8-9 are diagrams of step 3 of a manufacture method of an OLED substrate according to the present invention.
Figure 9:
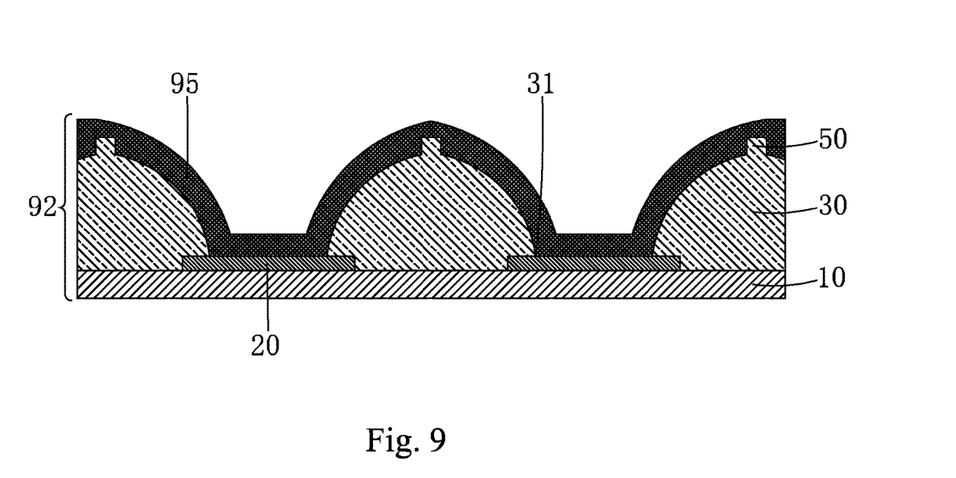

Specifically, heights of the plurality of spacers 50 are the same; preferably, all the shapes of the plurality of spacers 50 are columnar.

step 3, as shown in FIG. 8, coating a photoresist layer 95 on the first substrate 91, and the photoresist layer 95 covering the pixel definition layer 30, the plurality of spacers 50 and anodes 20;

as shown in FIG. 9, cutting the first substrate 91 coated with the photoresist layer 95 to obtain a plurality of second substrates 92.

Figure 10:
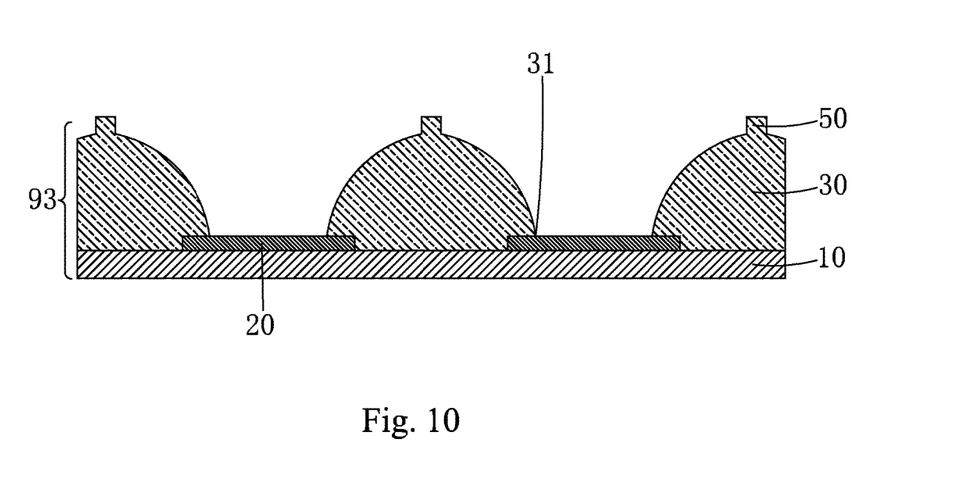
FIG. 10 is a diagram of step 4 of a manufacture method of an OLED substrate according to the present invention.

Specifically, in step 3, a knife flywheel is employed to cut the first substrate 91 coated with the photoresist layer 95.

step 4, as shown in FIG. 10, stripping the photoresist layer 95 on the second substrate 92 to obtain a third substrate 93.

Figure 11:
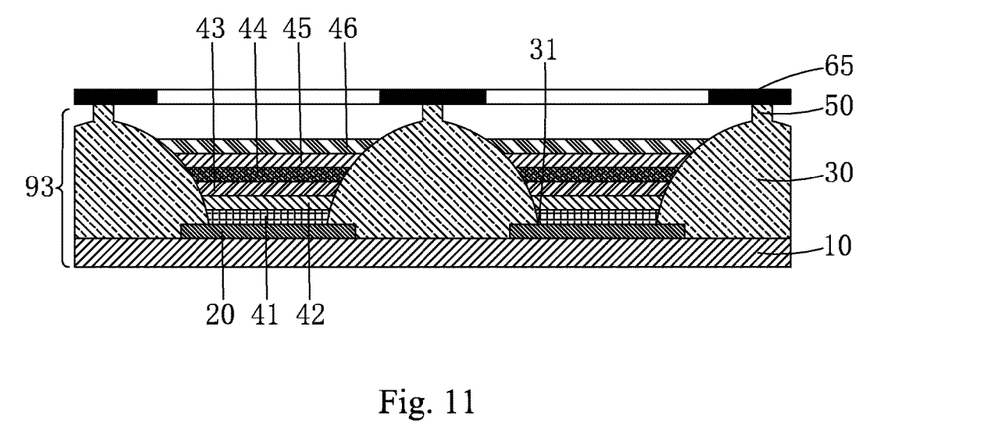
FIGS. 11-12 are diagrams of step 5 of a manufacture method of an OLED substrate according to the present invention and FIG. 12 is a structure diagram of the OLED substrate of the present invention.
Figure 12:
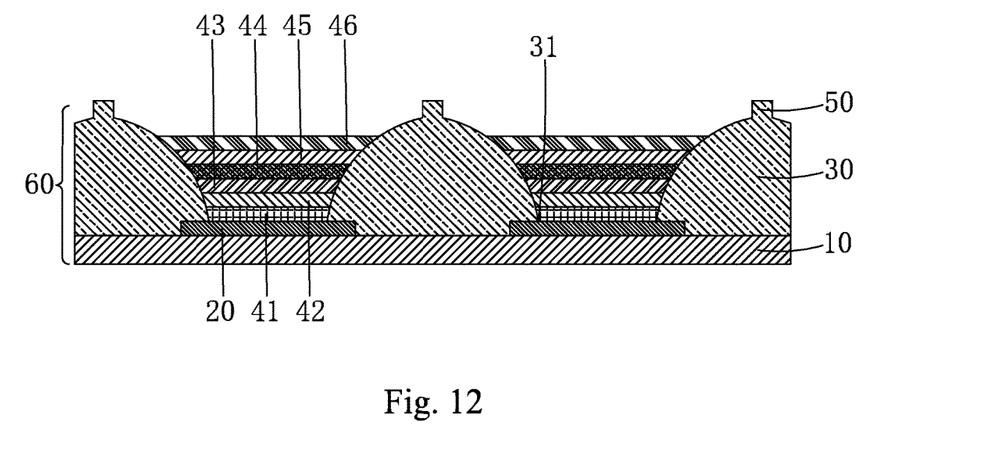

Specifically, in step 4, photoresist stripper is employed to strip the photoresist layer 95 on the second substrate 92. In the phtoresist stripping process, because the material of the pixel definition layer 30 is inorganic material, the photoresist stripper will not damage the pixel definition layer 30, and the pixel definition layer 30 can effectively protect the anodes 20 and the substrate 10 thereunder.

step 5, as shown in FIGS. 11-12, sequentially forming a Hole Injection Layer 41, a Hole Transporting Layer 42, an organic light emitting layer 43, an Electron Transport Layer 44, an Electron Injection Layer 45 and a cathode 46 from bottom to top in the plurality of openings 31 on the third substrate 93 to manufacture the OLED substrate 60.

Specifically, in step 5, a fine metal mask 65 is employed with an evaporation method to sequentially form the Hole Injection Layer 41, the Hole Transporting Layer 42, the organic light emitting layer 43, the Electron Transport Layer 44, the Electron Injection Layer 45 and the cathode 46 from bottom to top in the plurality of openings 31 on the third substrate 93.

Because the material of the pixel definition layer 30 is inorganic material, and the quality is more stable, and thus will not be volatilized to the fine metal mask 65 to lead to the pollution of the fine metal mask 65, and thus to decrease the clean frequency of the fine metal mask 65 and to raise the usage efficiency of the fine metal mask 65.

Specifically, a material of the cathode 46 is metal, and preferably, the material of the cathode 46 comprises at least one of magnesium, silver and aluminum.

In the aforesaid manufacture method of the OLED substrate, by utilizing the inorganic material to manufacture the pixel definition layer 30, it can reduce the risk that pixel definition layer 30 is wrong stripped in the photoresist stripping process, and meanwhile, to reduce the risk that the fine metal mask 65 is polluted in the evaporation process, and thus to decrease the clean frequency of the fine metal mask 65 and to raise the usage efficiency of the fine metal mask 65.

Figure 13:
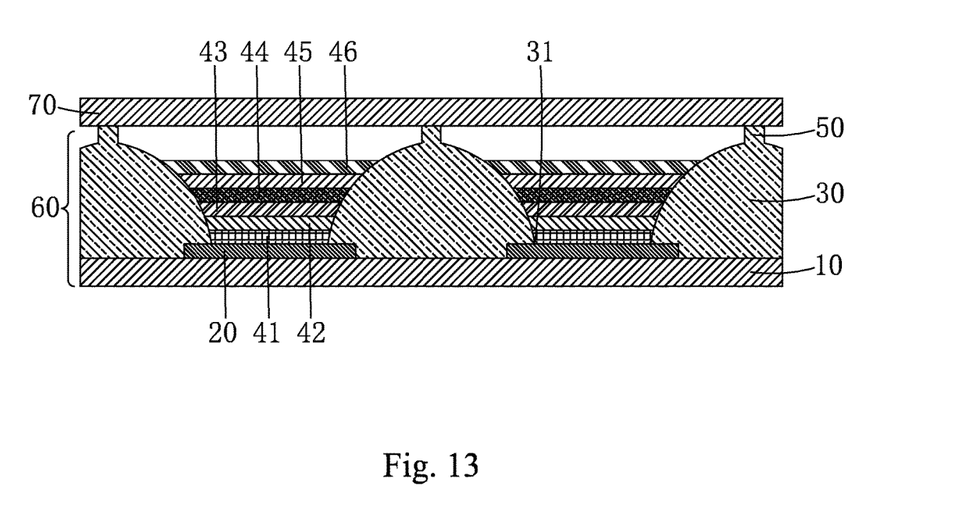
FIG. 13 is a diagram of step 20 of a manufacture method of an OLED display device according to the present invention and also a structure diagram of the OLED display device of the present invention.

On the basis of the aforesaid manufacture method of the OLED substrate, the present invention further provides a manufacture method of an OLED display device, comprising steps of:

step 10, as shown in FIGS. 5-12, manufacturing an OLED substrate 60 with the aforesaid manufactured method of the OLED substrate;

step 20, as shown in FIG. 13, providing a package cover plate 70, and para combining and tight fitting the package cover plate 70 and the OLED substrate 60, and the package cover plate 70 contacting the plurality of spacers 50 on the OLED substrate 60 to manufacture an OLED display device.

Specifically, a material of the package cover plate 70 is glass.

Specifically, in the OLED display device, the spacers 50 act to support the package cover plate 70.

In the aforesaid manufacture method of the OLED display device, by utilizing the manufacture method of the OLED substrate to manufacture the OLED substrate 60, it can reduce the risk that pixel definition layer 30 is wrong stripped in the photoresist stripping process, and meanwhile, to reduce the risk that the fine metal mask 65 is polluted in the evaporation process, and thus to decrease the clean frequency of the fine metal mask 65 and to raise the usage efficiency of the fine metal mask 65.

Please refer to FIG. 12. On the basis of the aforesaid manufacture method of the OLED substrate, the present invention further provides an OLED substrate 60, comprising a substrate 10, a plurality of anodes 20 separately located on the substrate 10; a pixel definition layer 30 located on the substrate 10 and the plurality of anodes 20, a plurality of spacers 50 located on the pixel definition layer 30, a plurality of openings 31 being located on the pixel definition layer 30 and respectively corresponding to the plurality of anodes 20, and a Hole Injection Layer 41, a Hole Transporting Layer 42, an organic light emitting layer 43, an Electron Transport Layer 44, an Electron Injection Layer 45 and a cathode 46 which are sequentially stacked up from bottom to top in the plurality of openings 31 and on the cathodes 20; wherein both materials of the pixel definition layer 30 and the plurality of spacers 50 are inorganic materials.

Preferably, the substrate 10 is a TFT substrate. The OLED substrate is applied in an AMOLED display device.

Specifically, the inorganic material comprises at least one of silicon nitride (SiNx) and silicon oxide (SiOx).

Specifically, a material of the anode 20 is transparent conductive metal oxide. Preferably, the material of the anode 20 is Indium Tin Oxide (ITO).

Specifically, a material of the cathode 46 is metal, and preferably, the material of the cathode 46 comprises at least one of magnesium, silver and aluminum.

Specifically, heights of the plurality of spacers 50 are the same; preferably, all the shapes of the plurality of spacers 50 are columnar.

In the foregoing OLED substrate, by utilizing the inorganic material to manufacture the pixel definition layer 30, it can reduce the risk that pixel definition layer 30 is wrong stripped in the photoresist stripping process. The structure of the pixel definition layer 30 is complete, and can effectively protect the anodes 20 and the substrate 10 thereunder, and the element performance is good.

Please refer to FIG. 13. On the basis of the aforesaid manufacture method of the OLED device, the present invention further provides an OLED display device, comprising an OLED substrate 60 and a package cover plate 70 which are oppositely located and tight fitted;

The OLED substrate 60 is the foregoing OLED substrate 60, and the package cover plate 70 contacts the plurality of spacers 50 on the OLED substrate 60.

Specifically, a material of the package cover plate 70 is glass.

Specifically, in the OLED display device, the spacers 50 act to support the package cover plate 70.

The aforesaid OLED display device comprises the aforesaid OLED substrate, and the element performance is good.

In conclusion, the present invention provides an OLED substrate and a manufacture method thereof. In the manufacture method of the OLED substrate of the present invention, by utilizing the inorganic material to manufacture the pixel definition layer, it can reduce the risk that pixel definition layer is wrong stripped in the photoresist stripping process, and meanwhile, reduce the risk that the fine metal mask is polluted in the evaporation process, and thus to decrease the clean frequency of the fine metal mask and to raise the usage efficiency of the fine metal mask. The OLED substrate of the present invention is manufactured by the aforesaid manufacture method of the OLED substrate. The structure of the pixel definition layer is complete, and can effectively protect the anodes and the substrate thereunder, and the element performance is good.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of an OLED substrate, comprising steps of:
   step 1, providing a substrate, and forming a plurality of anodes which are separately located on the substrate; depositing an inorganic film layer on the substrate and the plurality of anodes;
   step 2, employing a half tone mask to implement a patterning treatment to the inorganic film layer to obtain a pixel definition layer, a plurality of spacers located on the pixel definition layer, and a plurality of openings being located on the pixel definition layer and respectively corresponding to the plurality of anodes, and each opening exposes at least a portion of the corresponding anode to manufacture a first substrate;
   step 3, coating a photoresist layer on the first substrate, and the photoresist layer covering the pixel definition layer, the plurality of spacers and the plurality of anodes;
   cutting the first substrate coated with the photoresist layer to obtain a plurality of second substrates;
   step 4, stripping the photoresist layer on the second substrate to obtain a third substrate;
   step 5, sequentially forming a Hole Injection Layer, a Hole Transporting Layer, an organic light emitting layer, an Electron Transport Layer, an Electron Injection Layer and a cathode from bottom to top in the plurality of openings on the third substrate to manufacture the OLED substrate.

2. The manufacture method of the OLED substrate according to claim 1, wherein the substrate is a TFT substrate.

3. The manufacture method of the OLED substrate according to claim 1, wherein a material of the inorganic film layer comprises at least one of silicon nitride and silicon oxide.

4. The manufacture method of the OLED substrate according to claim 1, wherein a material of each of the plurality of anodes is transparent conductive metal oxide, and a material of the cathode is metal.

5. The manufacture method of the OLED substrate according to claim 1, wherein in step 3, a knife flywheel is employed to cut the first substrate coated with the photoresist layer;
   in step 4, photoresist stripper is employed to strip the photoresist layer on the second substrate;
   in step 5, a fine metal mask is employed with an evaporation method to sequentially form the Hole Injection Layer, the Hole Transporting Layer, the organic light emitting layer, the Electron Transport Layer, the Electron Injection Layer and the cathode from bottom to top in the plurality of openings on the third substrate.

6. A manufacture method of an OLED substrate, comprising steps of:
   step 1, providing a substrate, and forming a plurality of anodes which are separately located on the substrate; depositing an inorganic film layer on the substrate and the plurality of anodes;
   step 2, employing a half tone mask to implement a patterning treatment to the inorganic film layer to obtain a pixel definition layer, a plurality of spacers located on the pixel definition layer, and a plurality of openings being located on the pixel definition layer and respectively corresponding to the plurality of anodes, and each opening exposes at least a portion of the corresponding anode to manufacture a first substrate;
   step 3, coating a photoresist layer on the first substrate, and the photoresist layer covering the pixel definition layer, the plurality of spacers and the plurality of anodes;
   cutting the first substrate coated with the photoresist layer to obtain a plurality of second substrates;
   step 4, stripping the photoresist layer on the second substrate to obtain a third substrate;
   step 5, sequentially forming a Hole Injection Layer, a Hole Transporting Layer, an organic light emitting layer, an Electron Transport Layer, an Electron Injection Layer and a cathode from bottom to top in the plurality of openings on the third substrate to manufacture the OLED substrate;
   wherein the substrate is a TFT substrate;
   wherein a material of the inorganic film layer comprises at least one of silicon nitride and silicon oxide.

7. The manufacture method of the OLED substrate according to claim 6, wherein a material of each of the plurality of anodes is transparent conductive metal oxide, and a material of the cathode is metal.

8. The manufacture method of the OLED substrate according to claim 6, wherein in step 3, a knife flywheel is employed to cut the first substrate coated with the photoresist layer;

in step 4, photoresist stripper is employed to strip the photoresist layer on the second substrate;

in step 5, a fine metal mask is employed with an evaporation method to sequentially form the Hole Injection Layer, the Hole Transporting Layer, the organic light emitting layer, the Electron Transport Layer, the Electron Injection Layer and the cathode from bottom to top in the plurality of openings on the third substrate.

\* \* \* \* \*